(12) United States Patent
Sun et al.

(10) Patent No.: US 6,818,565 B1
(45) Date of Patent: Nov. 16, 2004

(54) GATE INSULATOR PRE-CLEAN PROCEDURE

(75) Inventors: Yeuh-Mao Sun, Taipei (TW); Yan-Fei Lin, Dong-gang (TW); Lin-Jun Wu, Hsin-Chu (TW); Yen-Ming Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/253,270

(22) Filed: Sep. 24, 2002

(51) Int. Cl.$^7$ .......................... H01L 21/461; B08B 6/00
(52) U.S. Cl. ........................ 438/745; 438/756; 134/1.3
(58) Field of Search .................. 438/756, 745, 438/749, 725; 134/1.1–1.3

(56) References Cited

U.S. PATENT DOCUMENTS

| | | | |
|---|---|---|---|
| 5,089,441 A | * | 2/1992 | Moleshi |
| 5,548,136 A | * | 8/1996 | Asai |
| 5,972,123 A | * | 10/1999 | Verhaverbeke |
| 6,007,641 A | * | 12/1999 | Vines et al. |
| 6,096,595 A | * | 8/2000 | Huang |
| 6,239,006 B1 | | 5/2001 | Shields ....................... 438/585 |
| 6,319,784 B1 | | 11/2001 | Yu et al. ...................... 438/301 |
| 6,352,941 B1 | | 3/2002 | Hwang et al. ............... 438/770 |
| 6,362,081 B1 | | 3/2002 | Chuang ....................... 438/522 |

* cited by examiner

Primary Examiner—Ha Tran Nguyen

(57) ABSTRACT

A method of forming a silicon dioxide gate insulator layer on the surface of a native oxide free semiconductor substrate, has been developed. After performing wet clean procedures used to remove organic contaminants, as well as inorganic contaminants from a semiconductor substrate, a first native oxide layer formed on the surface of the semiconductor substrate as a result of the wet clean procedures is removed via a hydrofluoric acid solution. The hydrofluoric acid procedure results in fluoride ions now located on the surface of the semiconductor substrate. Insertion of the semiconductor substrate into an anneal—oxidation chamber results in a second native oxide formed on the surface of the semiconductor substrate, with the thickness of the second native oxide limited by the presence of the fluoride ions on the surface of the semiconductor substrate. An anneal procedure performed at a temperature greater than 1000° C., results in removal of the second native oxide as well as removal of the fluoride ions. A thermal oxidation procedure is performed in situ, in the anneal—oxidation chamber, resulting in the growth of a silicon dioxide gate insulator layer on the native oxide free surface of the semiconductor substrate.

27 Claims, 2 Drawing Sheets

GATE INSULATOR PRE-CLEAN PROCEDURE

BACKGROUND OF THE INVENTION

1. Field of the Invention

The present invention relates to methods used to fabricate semiconductor devices, and more specifically to procedures used to reduce the native oxide on the surface of a semiconductor substrate prior to growth of a gate insulator layer.

2. Description of Prior Art

Micro-miniaturization, or the ability to fabricate semiconductor devices comprised of sub-micron features, has allowed the performance of semiconductor devices to be increased while the processing costs for a specific semiconductor chip comprised with sub-micron devices has been reduced. Part of the device performance increase is achieved via reductions of performance degrading parasitic junction capacitance as a result of the use of smaller device features. In addition the ability to obtain a greater amount of smaller semiconductor chips from a specific size starting substrate, still providing device densities equal to or greater than counterpart larger semiconductor chips in turn comprised with devices with larger features, result in a reduction of the fabrication cost for the specific, smaller semiconductor chip comprised with sub-micron features.

As the features of specific devices such as a metal oxide semiconductor field effect transistor (MOSFET), device are scaled down, specific aspects of the device such as gate insulator thickness has to also be scaled down. It is therefore imperative that the integrity of these thinner gate insulator layers be insured. The processes used to thermally grow silicon dioxide gate insulator layers always include a series of pre-clean procedures used to remove organic as well as inorganic contaminants from the surface of the semiconductor substrate that a gate insulator will be thermally grown on. However the pre-clean procedures are performed using wet solutions resulting in growth of native oxide on the cleaned semiconductor surface. The wet clean procedures employed are comprised with sulfuric acid and hydrogen peroxide which can result in the unwanted growth of about 15 Angstroms of native oxide. The low temperature of formation of the native oxide, about 100° C. or less, results in a native oxide exhibiting poor dielectric characteristics when compared to silicon dioxide layers grown at temperatures greater than 800° C. Therefore if a MOSFET device is designed for a 20 Angstrom gate insulator layer, designed to provide the desired device characteristics such as threshold voltage, the major portion of the gate insulator layer will be comprised of poor quality native oxide. The poor quality gate insulator layer can result in unwanted leakage or dielectric breakdown during operation.

The present invention will describe a method of forming a thin gate insulator layer in which a combination of pre-clean procedures results in zero Angstroms of native oxide prior to the thermal growth of a silicon dioxide gate insulator layer. The combination of pre-clean procedures comprised of a wet solution followed by an anneal procedure, performed in situ prior to gate insulator growth, results in a gate insulator layer not comprised with native oxide, with the entire thickness of the gate insulator layer obtained via thermal oxidation procedures, in contrast to counterparts wherein a portion of the gate insulator layer thickness resulted from a wet pre-clean procedure. The resulting thermally grown silicon dioxide gate insulator layer exhibits reduced leakage and improved dielectric breakdown characteristics when compared to counterpart gate insulator layers partially comprised with native oxide. Prior art, such as Yu et al, in U.S. Pat. No. 6,319,784 B1, Chuang, in U.S. Pat. No. 6,362,081 B1, Hwang et al in U.S. Pat. No. 6,352,941 B1, and Shields, in U.S. Pat. No. 6,239,006 B1, describe procedures to remove native oxide from semiconductor surfaces prior to either growing, or forming an overlaying layer on the cleaned surface. However none of these prior art describe the novel combination of process steps employed in this present invention, allowing all native oxide to be removed prior to thermal growth of a silicon dioxide gate insulator layer.

SUMMARY OF THE INVENTION

It is an object of this invention to thermally grow a silicon dioxide gate insulator on a semiconductor substrate.

It is another object of this invention to remove organic and inorganic contaminants from the surface of the semiconductor surface prior to thermal growth of the silicon dioxide gate insulator layer.

It is still another object of this invention to employ a combination of process steps featuring a hydrofluoric acid dip followed by an anneal procedure performed in situ in the same chamber to be used for the thermal oxidation procedure, to remove native oxide on the semiconductor substrate formed during the organic and inorganic pre-clean procedures, prior to the in situ thermal oxidation procedure.

In accordance with the present invention a process for thermally growing a silicon dioxide gate insulator layer on a semiconductor substrate featuring a combination of process steps used to totally remove native oxide from the surface of the semiconductor substrate prior to the thermal oxidation procedure, is described. A series of wet clean procedures is performed to a semiconductor substrate prior to a thermal oxidation procedure. A first cycle of the wet clean procedure features the use of sulfuric acid and hydrogen peroxide removing organic contaminants, while a second cycle of the wet clean procedure featuring the use of HCl and hydrogen peroxide, is used to remove inorganic contaminants such as metals. The wet clean procedures result in the growth of native oxide on the surface of the semiconductor substrate. A series of process steps are performed to totally remove the native oxide prior to thermal growth of the silicon dioxide layer. A hydrofluoric acid dip removes the native oxide and places fluoride ions on the surface of the semiconductor substrate restricting the regrowth of native oxide to less than 5 Angstroms. An anneal procedure performed in the chamber to be subsequently used for thermal growth of the silicon dioxide gate insulator layer, is employed to remove the thin regrown native oxide resulting in an oxide free semiconductor surface. The silicon dioxide gate insulator layer is then in situ grown in the same chamber used for the anneal procedure.

BRIEF DESCRIPTION OF THE DRAWINGS

The object and other advantages of this invention arc best described in the preferred embodiments with reference to the attached drawings that include.

DESCRIPTION OF THE PREFERRED EMBODIMENTS

Figure 1:
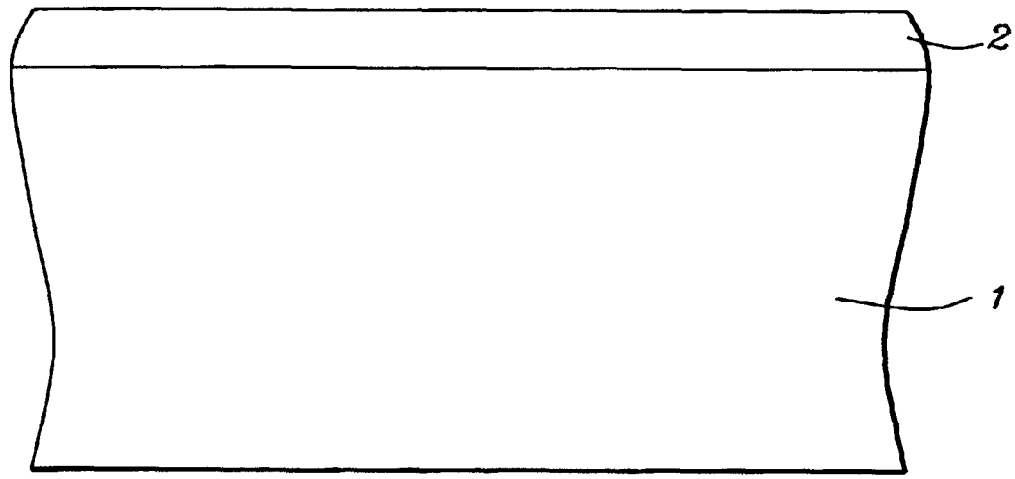
FIGS. 1–4, which schematically, in cross-sectional style, describe key stages of a process used to prepare a semiconductor substrate for a thermal oxidation procedure, featuring a combination of process steps employed to totally remove native oxide from the semiconductor surface prior to thermal growth of the silicon dioxide gate insulator layer.

The method of forming a silicon dioxide gate insulator layer on a semiconductor substrate, featuring a combination of process steps used to totally remove native oxide from the surface of the semiconductor substrate prior to a gate insulator, thermal oxidation procedure, will now be described in detail. Semiconductor substrate 1, comprised of P type single crystalline silicon, featuring a <100> crystallographic orientation, is used and schematically shown in FIG. 1 . The gate insulator layer to be described in this invention will be used as a component of a MOSFET device, and thus prior to gate insulator growth various regions such as well regions, threshold adjust regions, and punch through regions, may have previously been formed, however these regions will not be shown or described in this application. Prior to gate insulator growth contaminants residing on the surface of semiconductor substrate 1, have to be removed. Organic contaminants such as carbon, present as a result of previous photolithographic procedures are first removed to avoid incorporation into the gate insulator layer. This is accomplished using a solution comprised of sulfuric acid ($H_2SO_4$), and hydrogen peroxide ($H_2O_2$), performed at a temperature between about 120 to 140° C., for a time between about 60 to 180 min. Next a solution comprised of hydrochloric acid (HCl), and $NH_4OH$, is used to remove inorganic contaminants, such as metal, from the surface of semiconductor substrate 1, at a temperature between about 60 to 80° C., for a time between about 120 to 240 min. If unremoved incorporated organic contaminants would reduce the integrity of the silicon dioxide gate insulator layer in terms of breakdown strength, while unremoved metal would result in unwanted reductions in retention time for the MOSFET device. The employment of the above organic and inorganic pre-clean procedures, however result in the growth of between about 8 to 12 Angstroms of native oxide 2, (silicon oxide), on the surface of semiconductor substrate 1. This is schematically shown in FIG. 1.

The native oxide if left remaining during the growth of a silicon dioxide gate insulator layer of about 20 Angstroms, would provide about half the thickness of the final gate insulator layer thickness. Since the quality or integrity of the native oxide formed at a low temperature is not as great as the integrity of a silicon dioxide layer thermally grown at a higher temperature, the quality of this gate insulator layer would be compromised by the inclusion of the native oxide. In addition to the growth of native oxide during the organic and inorganic pre-clean procedures, an additional 4 to 6 Angstroms of native oxide, (silicon oxide), can form when the semiconductor substrate is inserted into the furnace to be used for the thermal oxidation procedure. The high temperature of the furnace encountered during the loading of the semiconductor substrates, in combination with environmental oxygen, can result in the additional native oxide growth. Native oxide layer 2, now at a thickness of about 15 Angstroms, will have significant negative influence, in terms of insulator quality of a silicon dioxide gate insulator layer to be grown to a final thickness of only about 20 Angstroms.

Figure 2:
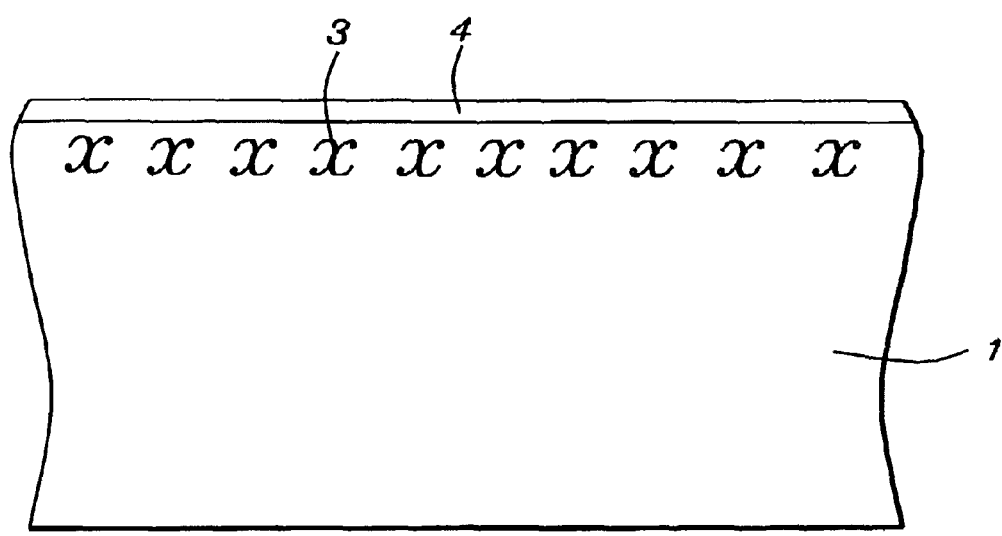
Figure 3:
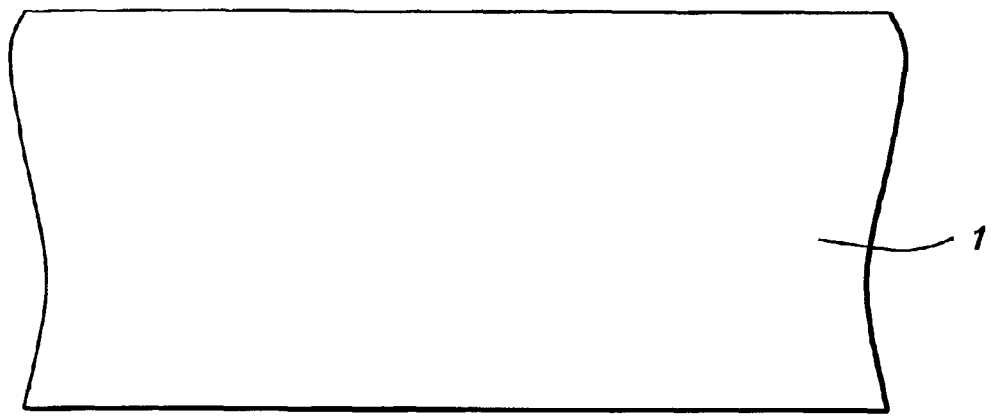

A novel combination of process steps employed to completely remove all native oxide (silicon oxide), from the surface of semiconductor substrate 1, prior to the growth of a silicon dioxide gate insulator layer, is next described, and schematically illustrated using FIGS. 2–3. After performance of the organic and inorganic pre-clean procedures resulting in the formation of native oxide 2, semiconductor substrate 1, is placed in a hydrofluoric (HF), acid bath, maintained at a temperature between about 18 to 22° C., for a time between about 50 to 70 sec, resulting in the complete removal of native oxide 2. Removal of the semiconductor substrate from the HF bath results in fluoride ions 3, still remaining on the surface of semiconductor substrate 1. The presence of fluoride ions 3, retard the regrowth of a native oxide layer 4, to only between about 3 to 5 Angstroms, as a result of subjecting semiconductor substrate 1, to the environment after removal from the HF acid bath. This is schematically shown in FIG. 2.

To completely remove thin, regrown native oxide layer 4, an anneal procedure is next performed in the same chamber to be used to subsequently, thermally grow a silicon dioxide gate insulator layer. Semiconductor substrate 1, including overlying native oxide layer 4, is placed in a in situ steam generation (ISSG), chamber, at a temperature between 1000 to 1100° C., for a time between about 30 to 60 sec, in a nitrogen or argon ambient. This procedure allows decomposition of native oxide layer 4, to occur resulting in an oxide free surface for semiconductor substrate 1. Fluoride ions 4, located on the surface of semiconductor substrate 1, are also removed during this anneal procedure. The result of the anneal procedure is schematically shown in FIG. 3.

Figure 4:
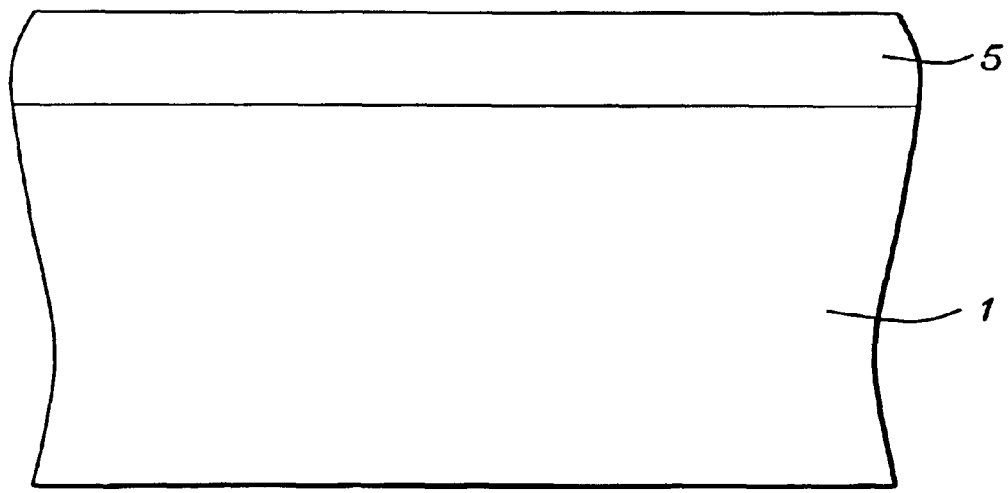

With semiconductor substrate 1, now featuring an native oxide free surface, still in the ISSG chamber an ambient of oxygen and steam is introduced at a temperature between about 900 to 1100° C., resulting in situ thermal oxidation of native oxide free, semiconductor substrate 1. Silicon dioxide gate insulator layer 5, schematically shown in FIG. 4, is obtained at a thickness between about 18 to 22 Angstroms, with the entire silicon dioxide layer grown at the elevated thermal oxidation temperature, thus allowing the integrity of silicon dioxide gate insulator layer 5, to be superior to counterpart silicon dioxide layers which were partially comprised with a native oxide component.

While this invention has been particularly shown and described with reference to the preferred embodiments thereof, it will be understood by those skilled in the art that various changes in form and details may be made without departing from the spirit and scope of this invention.

What is claimed is:

1. A method of growing an insulator layer on a semiconductor substrate, comprising the steps of:

performing a clean procedure to remove contaminants from the surface of said semiconductor substrate, with said clean procedure resulting in growth of a first native oxide layer on surface of said semiconductor substrate;

subjecting said semiconductor substrate and said first native oxide layer to an acid solution, resulting in removal of said first native oxide layer and resulting in ions from said acid solution now located on surface of said semiconductor substrate;

removing said semiconductor substrate from said acid solution with said ions located on surface of said semiconductor substrate limiting regrowth of native oxide layer to a second native oxide layer, thinner than said first native oxide layer;

with said ions remaining on surface of said semiconductor substrate, directly performing an anneal procedure in an argon ambient, in a chamber, resulting in removal of said second native oxide layer and removal of said ions; and performing a thermal oxidation procedure, in situ in said chamber, to grow said insulator layer on said semiconductor substrate.

2. The method of claim 1, wherein said contaminants are organic contaminants, removed from said semiconductor substrate via use of a solution comprised of sulfuric acid and hydrogen peroxide, used at a temperature between about 120 to 140° C.

3. The method of claim 1, wherein said contaminants are inorganic contaminants such as metal, removed from said semiconductor substrate via use of a solution comprised of hydrochloric acid and ammonium hydroxide, used at a temperature between about 60 to 80° C.

4. The method of claim 1, wherein said first native oxide layer is a silicon oxide layer formed at a thickness between about 8 to 12 Angstroms.

5. The method of claim 1, wherein said acid solution used to remove said first native oxide layer is a hydrofluoric acid solution.

6. The method of claim 1, wherein said ions located on surface of said semiconductor substrate after exposure to said acid solution, are fluoride ions.

7. The method of claim 1, wherein said second native oxide layer is formed at a thickness between about 3 to 5 Angstroms.

8. The method of claim 1, wherein said anneal procedure is performed in a chamber of a in situ steam generation tool.

9. The method of claim 1, wherein said anneal procedure is performed at a temperature between about 1000 to 1100° C., for a time between about 30 to 60 sec.

10. The method of claim 1, wherein said thermal oxidation procedure is performed in situ, in said chamber of in situ steam generation tool, at a temperature between about 900 to 1100° C., in an oxygen—steam ambient.

11. The method of claim 1, wherein said insulator layer, is a silicon dioxide layer, thermally grown to a thickness between about 18 to 22 Angstroms.

12. A method of growing a silicon dioxide gate insulator layer on a semiconductor substrate, comprising the steps of:
  performing a first clean procedure to remove organic contaminants from the surface of said semiconductor substrate;
  performing a second clean procedure to remove inorganic contaminants from the surface of said semiconductor substrate, with said first clean procedure and said second clean procedure resulting in growth of a first native oxide layer on surface of said semiconductor substrate;
  subjecting said semiconductor substrate, and overlying said first native oxide layer to a hydrofluoric acid solution resulting in removal of said first native oxide layer and resulting in fluoride ions now located on surface of said semiconductor substrate;
  removing said semiconductor substrate from said hydrofluoric acid solution with said fluoride ions located on surface of said semiconductor substrate limiting the regrowth of a second native oxide layer, thinner than said first native oxide layer,
  with said fluoride ions remaining on surface of said semiconductor substrate, directly transferring said semiconductor substrate to a chamber to perform an anneal procedure in an argon or nitrogen ambient, resulting in removal of said second native oxide layer and removal of said fluoride ions; and
  performing a thermal oxidation procedure, in situ in said chamber, to grow said silicon dioxide gate insulator layer on said semiconductor substrate.

13. The method of claim 12, wherein said first clean procedure, used to remove said organic contaminants, is performed in a solution comprised of sulfuric acid and hydrogen peroxide, used at a temperature between about 120 to 140° C.

14. The method of claim 12, wherein said second clean procedure, used to remove said inorganic contaminants such as metal, is performed in a solution comprised of hydrochloric acid and ammonium hydroxide, used at a temperature between about 60 to 80° C.

15. The method of claim 12, wherein said first native oxide layer is a silicon oxide layer formed at a thickness between about 8 to 12 Angstroms.

16. The method of claim 12, wherein said first native oxide layer is removed using a hydrofluoric acid solution, at a temperature between about 18 to 22° C., for a time between about 50 to 70 sec.

17. The method of claim 12, wherein said second native oxide layer is formed at a thickness between about 3 to 5 Angstroms.

18. The method of claim 12, wherein said anneal procedure is performed in a chamber of a in situ steam generation tool.

19. The method of claim 12, wherein said anneal procedure is performed at a temperature between about 1000 to 1100° C., for a time between about 30 to 60 sec.

20. The method of claim 12, wherein said thermal oxidation procedure is performed in situ in said chamber of in situ steam generation tool, at a temperature between about 900 to 1100° C., in an oxygen—steam ambient.

21. The method of claim 12, wherein said silicon dioxide gate insulator layer is thermally grown to a thickness between about 18 to 22 Angstroms.

22. A method of forming a silicon dioxide layer on a native oxide free semiconductor substrate, comprising the steps of:
  performing clean procedures in wet solutions to remove organic and inorganic contaminants from surface of said semiconductor substrate, with said clean procedures resulting in growth of a first native oxide layer on the surface of said semiconductor substrate;
  removing said first native oxide layer via use of a hydrofluoric acid solution, resulting in fluoride ions located on surface of said semiconductor substrate;
  with said fluoride ions remaining on surface of said semiconductor substrate, directly transferring semiconductor substrate into an anneal—oxidation chamber, with a second native oxide layer, thinner than said first native oxide layer, formed on surface of said semiconductor substrate during transfer procedure;
  performing an anneal procedure in said anneal—oxidation chamber in a nitrogen or argon ambient, resulting in removal of said second native oxide layer and removal of said fluoride ions; and
  performing an oxidation procedure, in situ in said anneal—oxidation chamber, resulting in growth of said silicon dioxide layer on said native oxide free semiconductor substrate.

23. The method of claim 22, wherein said first native oxide layer is a silicon oxide layer, formed during said clean procedures to a thickness between about 8 to 12 Angstroms.

24. The method of claim 22, wherein said second native oxide layer is a silicon oxide layer, formed at a thickness between about 3 to 5 Angstroms.

25. The method of claim 22, wherein said anneal procedure is performed in said anneal—oxidation chamber at a temperature between about 1000 to 1100° C., for a time between about 30 to 60 sec.

26. The method of claim 22, wherein said oxidation procedure is performed in situ, in said anneal—oxidation chamber, at a temperature between about 900 to 1100° C., in an oxygen—steam ambient.

27. The method of claim 22, wherein said silicon dioxide layer is thermally grown to a thickness between about 18 to 22 Angstroms.

* * * * *